(12) United States Patent
Matsuda (10) Patent No.: US 7,273,814 B2
(45) Date of Patent: Sep. 25, 2007

(54) METHOD FOR FORMING A RUTHENIUM METAL LAYER ON A PATTERNED SUBSTRATE

(75) Inventor: Tsukasa Matsuda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 203 days.

(21) Appl. No.: 10/907,022

(22) Filed: Mar. 16, 2005

(65) Prior Publication Data
US 2006/0211228 A1   Sep. 21, 2006

(51) Int. Cl.
*H01L 21/44* (2006.01)
(52) U.S. Cl. .................. 438/680; 438/622; 438/648; 438/650; 257/E21.018
(58) Field of Classification Search ............... None
See application file for complete search history.

(56) References Cited

U.S. PATENT DOCUMENTS

| | | | |
|---|---|---|---|
| 6,303,809 B1 | 10/2001 | Chi et al. .................. 556/136 |
| 6,440,495 B1 | 8/2002 | Wade et al. ................ 427/250 |
| 6,605,735 B2 | 8/2003 | Kawano et al. ............. 556/136 |
| 6,713,373 B1 | 3/2004 | Omstead .................... 438/608 |
| 6,737,313 B1 * | 5/2004 | Marsh et al. ............... 438/240 |
| 2002/0146513 A1 | 10/2002 | Jin et al. |
| 2003/0109110 A1 | 6/2003 | Kim |
| 2003/0129306 A1 | 7/2003 | Wade et al. ........... 427/255.28 |
| 2003/0232497 A1 | 12/2003 | Xi et al. |
| 2004/0013577 A1 | 1/2004 | Ganguli et al. ............. 422/129 |
| 2004/0105934 A1 | 6/2004 | Chang et al. .......... 427/255.28 |
| 2004/0224475 A1 * | 11/2004 | Lee et al. .................... 438/399 |
| 2004/0241321 A1 | 12/2004 | Ganguli et al. ........ 427/255.28 |
| 2005/0081882 A1 | 4/2005 | Greer et al. ................. 134/1.1 |
| 2005/0110142 A1 | 5/2005 | Lane et al. .................. 257/751 |
| 2005/0186341 A1 | 8/2005 | Hendrix et al. .......... 427/248.1 |

FOREIGN PATENT DOCUMENTS

| | | |
|---|---|---|
| EP | 1130628 A1 | 9/2001 |
| WO | 2005020317 A2 | 3/2003 |
| WO | 03056612 A1 | 7/2003 |

OTHER PUBLICATIONS

European Patent Office, International Search Report and Written Opinion, Aug. 11, 2006, 9 pp.

* cited by examiner

*Primary Examiner*—Michael Lebentritt
*Assistant Examiner*—Kyoung Lee
(74) *Attorney, Agent, or Firm*—Wood, Herron & Evans, LLP (57) ABSTRACT

A method for forming a ruthenium metal layer includes providing a patterned substrate in a process chamber of a deposition system, where the patterned substrate contains one or more vias or trenches, or combinations thereof, depositing a first ruthenium metal layer on the substrate in an atomic layer deposition process, and depositing a second ruthenium metal layer on the first ruthenium metal layer in a thermal chemical vapor deposition process. The deposited ruthenium metal layer can be used as a diffusion barrier layer, a seed layer for electroplating, or both.

9 Claims, 4 Drawing Sheets

METHOD FOR FORMING A RUTHENIUM METAL LAYER ON A PATTERNED SUBSTRATE

FIELD OF THE INVENTION

The present invention relates to semiconductor processing, and more particularly, to a method for forming a thin ruthenium metal layer on a patterned substrate. The ruthenium metal layer can be used as a diffusion barrier layer, a seed layer for electroplating, or both.

BACKGROUND OF THE INVENTION

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, including such materials as chromium, tantalum, molybdenum, and tungsten. Each of these materials exhibits low miscibility in Cu. More recently, other materials, such as ruthenium (Ru) and rhodium (Rh) have been identified as potential barrier layers since they are expected to behave similarly to conventional refractory metals. However, it is possible that the use of Ru or Rh can permit the use of only one barrier layer, as opposed to two layers, such as Ta/TaN. For example, it is possible that a Ru layer can replace the Ta/TaN barrier layer. Moreover, current research is finding that a Ru layer can further replace the Cu seed layer, and bulk Cu fill can proceed directly following Ru deposition.

Ru layers can be deposited from a ruthenium-containing precursor, such as a ruthenium carbonyl precursor or a ruthenium organometallic precursor. However, Ru deposition processes can suffer from low deposition rates due to the low vapor pressures of a number of ruthenium precursors and the transport issues associated therewith, thereby making deposition of Ru layers impractical even if the deposition provides good step coverage over high-aspect-ratio features. On the other hand, Ru deposition processes with high enough deposition rates for manufacturing can suffer from unacceptable step coverage over high-aspect-ratio features. Overall, the inventors have observed that new Ru deposition processes are needed that can provide high deposition rates and good step coverage over high-aspect-ratio features.

SUMMARY OF THE INVENTION

The present invention provides a method that combines the good conformality and step coverage of atomic layer deposition (ALD) processing and the high deposition rates of chemical vapor deposition (CVD) processing to deposit Ru metal layers over high-aspect ratio features. Embodiments of the invention allow for depositing Ru metal layers for barrier and seed applications, including a Ru seed layer and a Ru diffusion barrier for Cu metallization technology.

Thus, the method includes providing a patterned substrate in a process chamber of a deposition system, wherein the patterned substrate contains one or more vias or trenches, or combinations thereof, depositing a first ruthenium metal layer on the substrate in an atomic layer deposition process, and depositing a second ruthenium metal layer on the first ruthenium metal layer in a thermal chemical vapor deposition process.

According to an embodiment of the invention, the method includes providing a patterned substrate in a process chamber of a deposition system, wherein the patterned substrate contains one or more vias or trenches, or combinations thereof, depositing a first ruthenium metal layer on the substrate in a plasma-enhanced atomic layer deposition process by alternating exposures of the substrate to a) a ruthenium organometallic precursor and b) a hydrogen-containing gas in a plasma, and depositing a second ruthenium metal layer on the first ruthenium metal layer in a thermal chemical vapor deposition process by exposing the substrate to a ruthenium organometallic precursor and a hydrogen-containing gas.

According to another embodiment of the invention, the method includes providing a patterned substrate in a process chamber of a deposition system, wherein the patterned substrate contains one or more vias or trenches, or combinations thereof, depositing a first ruthenium metal layer on the substrate in an atomic layer deposition process, wherein the atomic layer deposition process comprises a thermal atomic layer deposition process by alternating exposures of the substrate to a) a ruthenium organometallic precursor and b) a hydrogen-containing gas, and depositing a second ruthenium metal layer on the first ruthenium metal layer in a thermal chemical vapor deposition process by exposing the substrate to a ruthenium organometallic precursor and a hydrogen-containing gas.

DETAILED DESCRIPTION OF SEVERAL EMBODIMENTS OF THE INVENTION

Embodiments of the invention provide a method of deposition for forming a ruthenium metal layer containing first and second ruthenium metal layers. The deposition process combines the good step coverage and good conformality of ALD processing with the high deposition rate of CVD processing to provide a manufacturable process for forming a ruthenium metal layer with desired properties on substrate features, including vias or trenches, or combinations thereof.

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
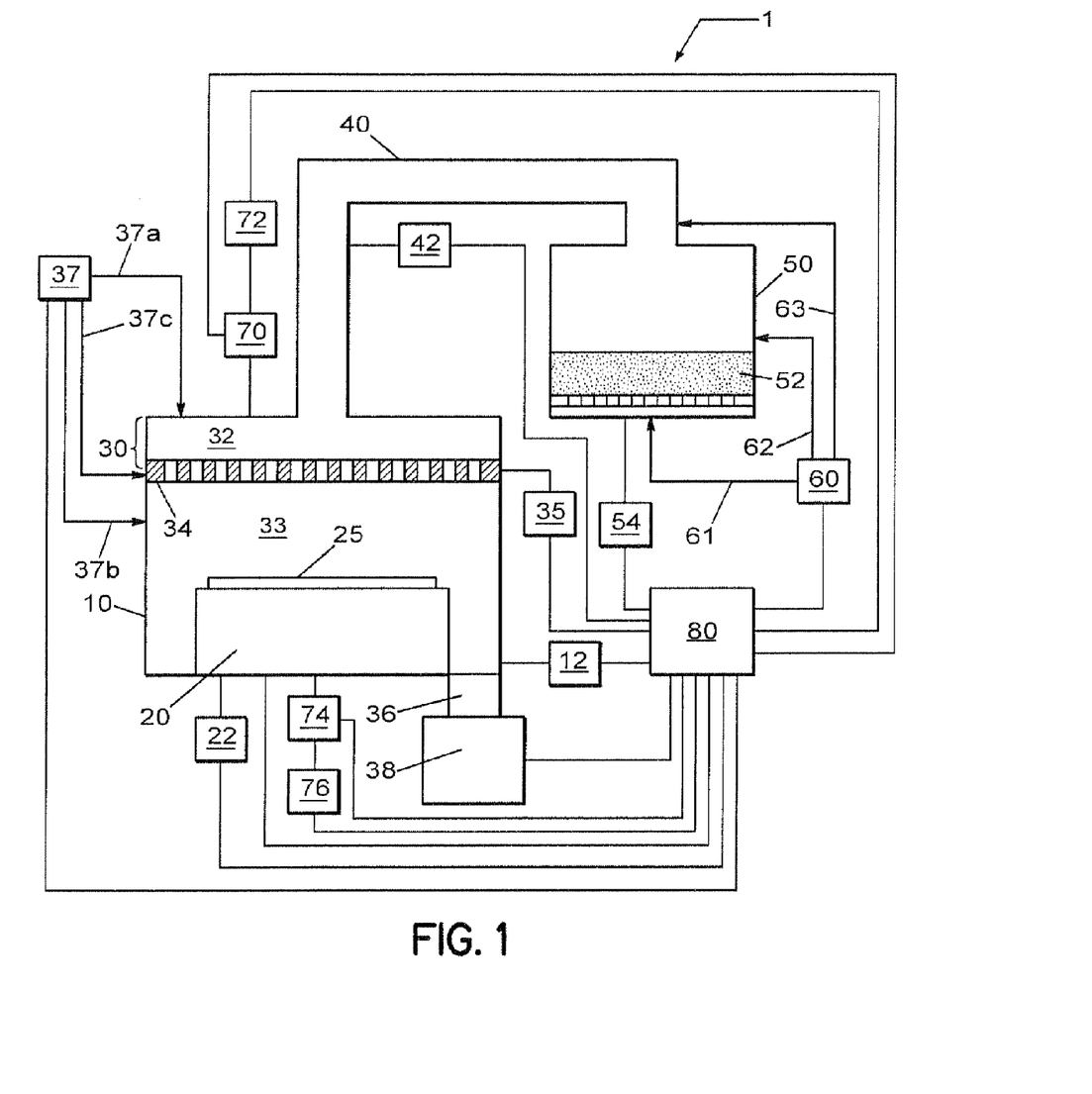
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a Ru metal layer on a substrate from a ruthenium organometallic precursor according to one embodiment of the invention. The deposition system 1 comprises a process chamber 10 having a substrate holder 20 configured to support a substrate 25, upon which the metal layer is formed. The process chamber 10 is coupled to a metal precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor evaporation system 50 to a pressure suitable for forming the metal layer on the substrate 25, and suitable for evaporation of the ruthenium organometallic precursor 52 in the metal precursor evaporation system 50.

Still referring to FIG. 1, the metal precursor evaporation system 50 is configured to store a ruthenium organometallic precursor 52, to heat the ruthenium organometallic precursor 52 to a temperature sufficient for evaporating the ruthenium organometallic precursor 52, and to introduce ruthenium organometallic precursor vapor to the vapor precursor delivery system 40. The ruthenium organometallic precursor 52 can be solid under the selected heating conditions in the metal precursor evaporation system 50. Alternately, the ruthenium organometallic precursor 52 can be a liquid. Below, using a solid ruthenium organometallic precursor 52 is described, however, those skilled in the art will appreciate that ruthenium organometallic precursors that are liquids under the selected heating conditions can be used without departing from the scope of the invention. In particular, liquid delivery systems that can include a liquid precursor source, a liquid mass flow controller, and a vaporizer, are well known in the art.

According to an embodiment of the invention, the ruthenium organometallic precursor can be the liquid precursor (2,4-dimethylpentadienyl) (ethylcyclopentadienyl) ruthenium, Ru(DMPD)(EtCp). According to another embodiment of the invention, the ruthenium precursor can be the solid precursor bis(2,4-dimethylpentadienyl) ruthenium, Ru(DMPD)$_2$. According to yet another embodiment of the invention, the ruthenium precursor can be the liquid precursor (2,4-dimethylpentadienyl) (methylcyclopentadienyl) ruthenium. These three precursors have vapor pressures of about 0.1 Torr at 75° C. The above-mentioned precursors are not required for the invention, as other ruthenium organometallic precursors may be used, including the liquid precursor bis(ethylcyclopentadienyl) ruthenium, Ru(EtCp)$_2$, as well as combinations of these and other precursors.

In order to achieve the desired temperature for evaporating (or subliming) the ruthenium organometallic precursor 52, the metal precursor evaporation system 50 is coupled to an evaporation temperature control system 54 configured to control the evaporation temperature. For instance, the temperature of the ruthenium organometallic precursor 52 can be elevated to between about 30° C. and about 150° C. As the ruthenium organometallic precursor is heated to cause evaporation (or sublimation), a carrier gas can be passed over or through the ruthenium organometallic precursor 52, or any combination thereof. Alternately, other embodiments contemplate omitting a carrier gas. When a carrier gas is used, it can include, for example, an inert gas, such as a noble gas (i.e., He, Ne, Ar, Kr, or Xe), or a combination of two or more thereof.

For example, a gas supply system 60 is coupled to the metal precursor evaporation system 50, and it is configured to supply a carrier gas, a hydrogen-containing gas, or a mixture thereof, beneath the ruthenium organometallic precursor 52 via feed line 61, or over the ruthenium organometallic precursor 52 via feed line 62. In addition, or in the alternative, the gas supply system 60 is coupled to the vapor precursor delivery system 40 downstream from the metal precursor evaporation system 50 to supply the gas to the vapor of the ruthenium organometallic precursor 52 via feed line 63 as or after it enters the vapor precursor delivery system 40. Although not shown, the gas supply system 60 can comprise a carrier gas source, a hydrogen-containing gas source, one or more control valves, one or more filters, and a mass flow controller. For instance, the flow rate of the carrier gas and the hydrogen-containing gas can be between about 0.1 standard cubic centimeters per minute (sccm) and about 1000 sccm. Alternately, the flow rates can be between about 10 sccm and about 500 sccm. Still alternately, the flow rates can be between about 50 sccm and about 200 sccm. According to an embodiment of the invention, the hydrogen-containing gas can be H$_2$, NH$_3$, or a combination thereof.

Downstream from the metal precursor evaporation system 50, the process gas containing the ruthenium organometallic precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the ruthenium organometallic precursor vapor as well as condensation of the ruthenium organometallic precursor vapor.

Referring again to FIG. 1, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

According to an embodiment of the invention, a gas source 37 is coupled to the process chamber 10 and the gas source 37 can be configured to add hydrogen-containing gas, a dilution gas, or a mixture thereof to the process gas containing the ruthenium organometallic precursor vapor. As shown in FIG. 1, the gas source 37 can be coupled to the vapor distribution system 30 via feed line 37a and configured to add the hydrogen-containing gas/dilution gas to the process gas in the vapor distribution plenum 32 before the process gas passes through the vapor distribution plate 34 into the processing zone 33. Alternately, the gas source 37 can be coupled to the process chamber 10 via feed line 37b and configured to add the hydrogen-containing gas/dilution gas to the process gas in the processing zone 33 above the substrate 25 after the process gas passes through the vapor distribution plate 34. Still alternately, the gas source 37 can be coupled to the vapor distribution system 30 via feed line 37c and configured to add the hydrogen-containing gas/dilution gas to the process gas in the distribution plate 34. As will be appreciated by those skilled in the art, the hydrogen-containing gas/dilution gas from the gas source 37 can be added to the process gas at other locations in the vapor distribution system 30 and the process chamber 10 without departing from the scope of the invention.

Still referring to FIG. 1, the deposition system 1 is configured to facilitate the generation of plasma in the processing region 33 of the process chamber 10. The plasma can be generated by a RF plasma source that contains the vapor distribution plate 34 (upper electrode) to which RF power is coupled from a RF generator 72 through an impedance match network 70. A frequency for the application of RF power to the vapor distribution plate 34 can range from 10 MHz to 200 MHz and can be 60 MHz. The RF power applied to the vapor distribution plate 34 can be between about 500 Watts (W) and about 2200 W. The RF plasma source further includes a RF source for applying RF power to the substrate holder 20 to bias the substrate 25. The RF source contains a RF generator 76 and an impedance match network 74 that serves to maximize the transfer of RF power to plasma to the processing region 33 by minimizing the reflected power. Match network topologies (e.g., L-type, π-type, T-type) and automatic control methods are known in the art. A frequency for the application of power to the substrate holder 20 can range from 0.1 MHz to 30 MHz and can be 2 MHz. The RF power applied to the substrate holder 20 can be between about 0 W and about 1000 W. Moreover, a controller 80 is coupled to the RF generators 72 and 76 and the impedance match networks 70 and 74 in order to control the application of RF power to the vapor distribution plate 34 and the substrate holder 20. In an alternate embodiment, RF power can be applied to the substrate holder 20 at multiple frequencies.

Once the process gas containing the ruthenium organometallic precursor vapor enters the processing zone 33 of process chamber 10, the ruthenium organometallic precursor vapor is exposed to the heated substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Still referring to FIG. 1, the deposition system 1 includes a control system 80 configured to operate and control the operation of the deposition system 1. In addition to being coupled to the RF generators 72, 76 and the match networks 70, 74 as described above, the control system 80 is coupled to the process chamber 10, the substrate holder 20, the substrate temperature control system 22, the chamber temperature control system 12, the vapor distribution system 30, the vapor precursor delivery system 40, the metal precursor evaporation system 50, the distribution plate temperature control system 35, and the gas supply system 60. The control system 80 is further coupled to the gas valves (not shown) that facilitate fast gas switching during ALD processing.

Figure 2:
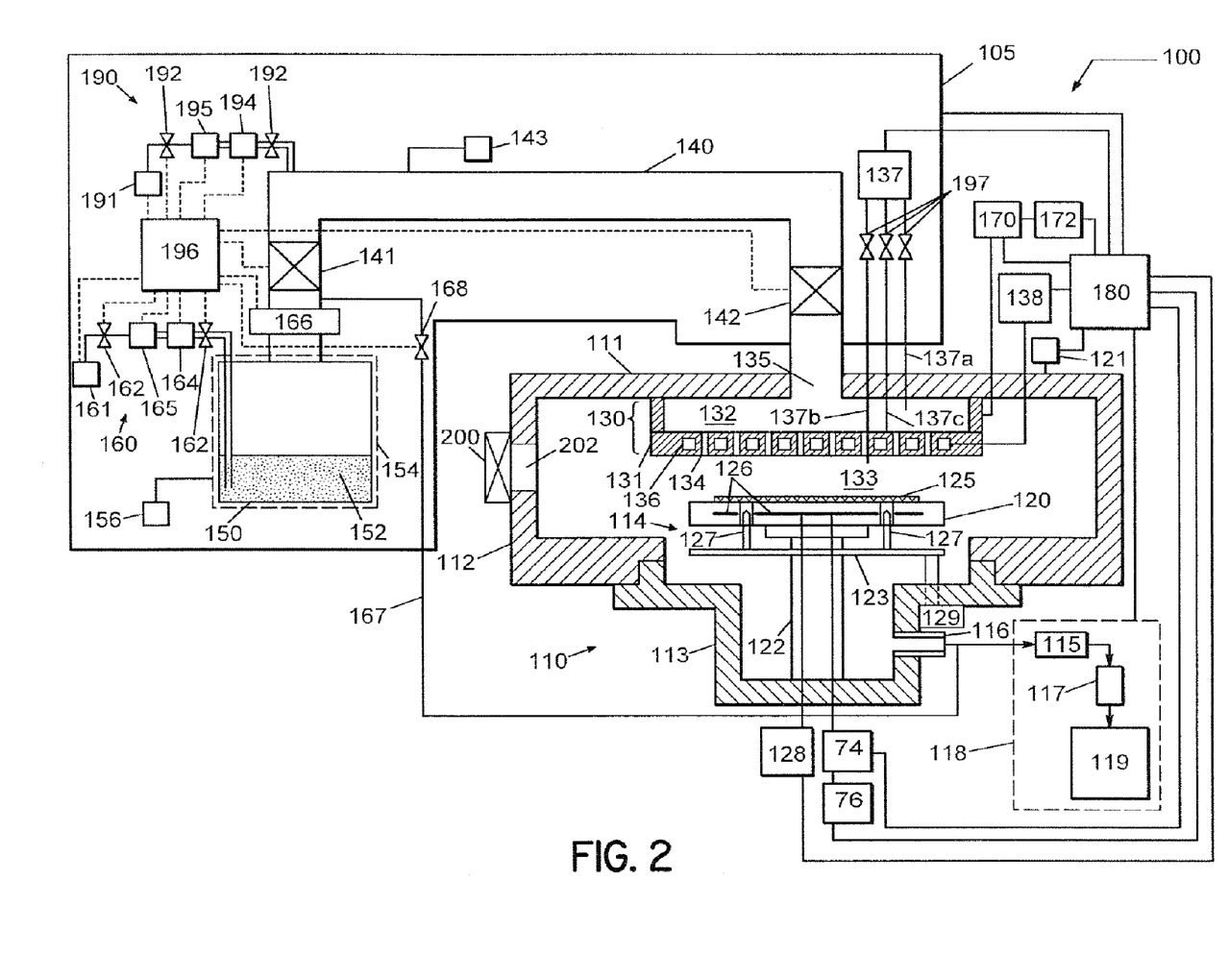
FIG. 2 depicts a schematic view of a deposition system according to another embodiment of the invention.

In another embodiment, FIG. 2 illustrates a deposition system 100 for depositing a metal film, such as a ruthenium film, on a substrate. The deposition system 100 comprises a process chamber 110 having a substrate holder 120 configured to support a substrate 125, upon which the metal layer is formed. The process chamber 110 is coupled to a precursor delivery system 105 having a metal precursor evaporation system 150 configured to store and evaporate a ruthenium organometallic precursor 152, and a vapor precursor delivery system 140 configured to transport the vapor of the ruthenium organometallic precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 is exposed to the ruthenium organometallic precursor vapor to deposit a ruthenium metal layer on the substrate 125. The substrate holder 120 is heated to a pre-determined temperature that is suitable for depositing the desired ruthenium metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 100° C., or from about 40° C. to about 80° C. A pressure gauge (not shown) is used to measure the process chamber pressure.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

According to an embodiment of the invention, a gas source 137 is coupled to the process chamber 110 and is configured to add a hydrogen-containing gas, a dilution gas, or a combination thereof, to the process gas containing the ruthenium organometallic precursor vapor using feed lines 137a, 137b, and/or 137c, valves 197, one or more filters (not shown), and a mass flow controller (not shown). As shown in FIG. 1, the gas source 137 can be coupled to the vapor distribution system 130 of process chamber 110 and is configured to add the hydrogen-containing gas/dilution gas to the process gas in the vapor distribution plenum 132 via feed line 137a before the process gas passes through the vapor distribution plate 131 into the processing zone 133 above the substrate 125, or the gas source 137 can be configured to add the hydrogen-containing gas/dilution gas to the process gas inside the vapor distribution plate 131 via feed line 137c. Alternately, the gas source 137 can be coupled to the process chamber 110 and is configured to add the hydrogen-containing gas/dilution gas to the process gas in the processing zone 133 via feed line 137b after the process gas passes through the vapor distribution plate 131. As will be appreciated by those skilled in the art, the hydrogen-containing gas/dilution gas can be added to the process gas at other locations in the process chamber 110 without departing from the scope of the invention.

Furthermore, an opening 135 is provided in the upper chamber section 111 for introducing a ruthenium organometallic precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the ruthenium organometallic precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor evaporation system 150 is configured to hold a ruthenium organometallic precursor 152 and to evaporate (or sublime) the ruthenium organometallic precursor 152 by elevating the temperature of the ruthenium organometallic precursor. A precursor heater 154 is provided for heating the ruthenium organometallic precursor 152 to maintain the ruthenium organometallic precursor 152 at a temperature that produces a desired vapor pressure of ruthenium organometallic precursor 152. The precursor heater 154 is coupled to an evaporation temperature control system 156 configured to control the temperature of the ruthenium organometallic precursor 152. For example, the precursor heater 154 can be configured to adjust the temperature of the ruthenium organometallic precursor 152 from about 40° C. to about 150° C., or from about 60° C. to about 90° C.

As the ruthenium organometallic precursor 152 is heated to cause evaporation (or sublimation), a carrier gas, a hydrogen-containing gas, or a mixture thereof, can be passed over or through the ruthenium organometallic precursor 152, or any combination thereof. The carrier gas can include, for example, an inert gas, such as a noble gas (i.e., He, Ne, Ar, Kr, Xe). Alternately, other embodiments contemplate omitting a carrier gas. According to an embodiment of the invention, a reactant gas can be added to the carrier gas. Alternately, other embodiments contemplate the reactant gas replacing the carrier gas. For example, a gas supply system 160 is coupled to the metal precursor evaporation system 150, and it is configured to, for instance, flow the carrier gas, the hydrogen-containing gas, or both, over or through the ruthenium organometallic precursor 152. Although not shown in FIG. 2, gas supply system 160 can also or alternatively be coupled to the vapor precursor delivery system 140 to supply the carrier gas and/or hydrogen-containing gas to the vapor of the metal precursor 152 as or after it enters the vapor precursor delivery system 140. The gas supply system 160 can comprise a gas source 161 containing a carrier gas, a hydrogen-containing gas, or a mixture thereof, one or more control valves 162, one or more filters 164, and a mass flow controller 165. For instance, the mass flow rate of carrier gas or the hydrogen-containing gas can range from approximately 0.1 sccm to approximately 1000 sccm. According to an embodiment of the invention, the hydrogen-containing gas can be $H_2$, $NH_3$, or a combination thereof.

Additionally, a sensor 166 is provided for measuring the total gas flow from the metal precursor evaporation system 150. The sensor 166 can, for example, comprise a mass flow controller, and the amount of ruthenium organometallic precursor vapor delivered to the process chamber 110 can be determined using sensor 166 and mass flow controller 165. Alternately, the sensor 166 can comprise a light absorption sensor to measure the concentration of the ruthenium organometallic precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the ruthenium organometallic precursor vapor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the ruthenium organometallic precursor vapor in the vapor line. The temperature of the vapor lines can be controlled from about 20° C. to about 100° C., or from about 40° C. to about 90° C.

Moreover, a hydrogen-containing gas can be supplied from a gas supply system 190. For example, the gas supply system 190 is coupled to the vapor precursor delivery system 140, and it is configured to, for instance, mix the hydrogen gas/dilution gas with the ruthenium organometallic precursor vapor in the vapor precursor delivery system 140, for example, downstream of valve 141. The gas supply system 190 can comprise a reactant gas source 191, one or more control valves 192, one or more filters 194, and a mass flow controller 195. For instance, the mass flow rate of a hydrogen gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the hydrogen-containing gas, and the ruthenium organometallic precursor vapor. Sensor 166 is also connected to controller 195 and, based on output of the sensor 166, controller 195 can control the gas flow through mass flow controller 165 to obtain the desired ruthenium organometallic precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater).

Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted ruthenium organometallic precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, the deposition system 100 is configured to facilitate the generation of plasma in the processing region 133 of the process chamber 110. The plasma can be generated by a RF plasma source that contains the vapor distribution plate 131 (upper electrode) to which RF power is coupled from a RF generator 172 through an impedance match network 170. A typical frequency for the application of RF power to the vapor distribution plate 34 can range from 10 MHz to 200 MHz and can be 60 MHz. The RF power applied to the vapor distribution plate 34 can be between about 500 W and about 2200 W. The RF plasma source further includes a RF source for applying RF power to the substrate holder 120 to bias the substrate 125. The RF source contains a RF generator 176 and an impedance match network 174 that serves to maximize the transfer of RF power to plasma to the processing region 133 by minimizing the reflected power. Match network topologies (e.g., L-type, π-type, T-type) and automatic control methods are known in the art. A frequency for the application of power to the substrate holder 120 ranges from 0.1 MHz to 30 MHz and can be 2 MHz. The RF power applied to the substrate holder 120 can be between about 0 W and about 1000 W. Moreover, the controller 180 is coupled to the RF generators 172 and 176 and the impedance match networks 170 and 174 in order to control the application of RF power to the vapor distribution plate 131 and the substrate holder 120. In an alternate embodiment, RF power can be applied to the substrate holder 120 at multiple frequencies.

Still referring to FIG. 2, the controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and evaporation temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of a processing system controller 180 is a DELL PRECISION WORKSTATION 610™, available from Dell Corporation, Dallas, Tex. The controller 180 may also be implemented as a general-purpose computer, digital signal process, etc.

The controller 180 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
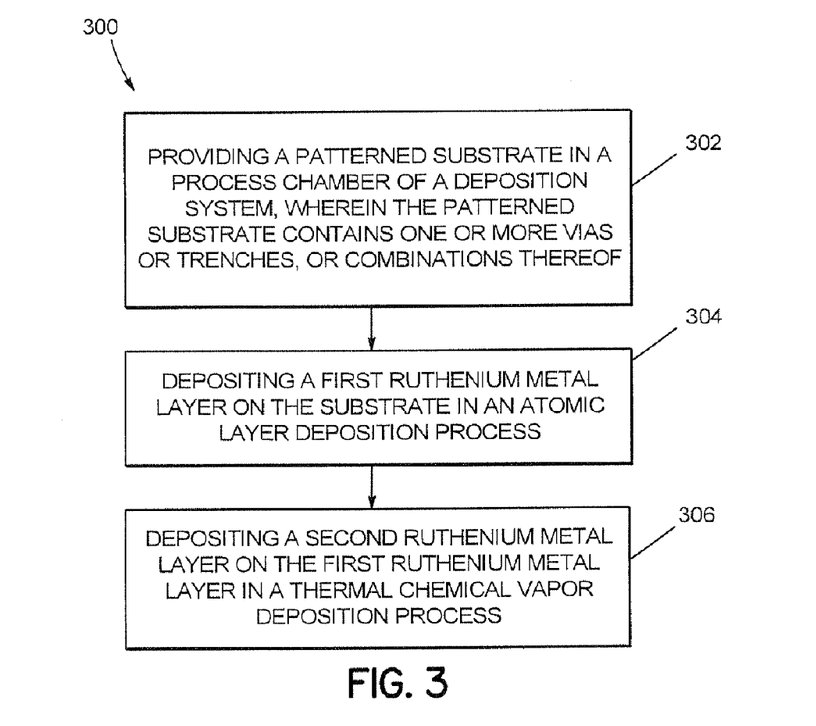
FIG. 3 illustrates a method of depositing a Ru metal layer on a substrate according to an embodiment of the invention.

FIG. 3 illustrates a method of depositing a metal layer on a substrate according to an embodiment of the invention. The method 300 includes, at 302, providing a substrate in a process chamber of a deposition system. For example, the deposition system can include the depositions systems described in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or a combinations thereof. The vias and trenches can, for example, have openings that are in the sub-micron range, for example less than 65 nm or less than 45 nm. The vias and trenches can have high aspect ratios (depth/width), for example between about 2 and about 10, but the invention is not limited to these aspect ratios.

At 304, a first ruthenium metal layer is deposited on the substrate in an ALD process. The ALD process can be a thermal atomic layer deposition (TALD) or a plasma-enhanced atomic layer deposition (PEALD) process. The PEALD process includes alternatingly exposing the substrate to a ruthenium organometallic precursor to adsorb a layer of the precursor or a partially decomposed precursor on the substrate and exposing the substrate to plasma containing a hydrogen-containing gas. The TALD process includes alternatingly exposing the substrate to a ruthenium organometallic precursor and exposing the substrate to a hydrogen-containing gas. The alternating exposures can be repeated until a first ruthenium metal layer with a desired thickness is formed on the substrate. For example, the alternating exposures can be repeated until a thickness of about 1-10 nm is achieved.

The process chamber can be purged with an inert gas between the alternating exposures in order to prevent gas-phase interactions to take place in the process chamber. Besides separating the exposures, inert gas has a cleaning effect that includes transporting excess reactants from the process chamber and desorbed materials from the process chamber walls. The substrate temperature, process chamber wall temperature and purging times can be fixed in order to maintain a layer of the ruthenium organometallic precursor on the substrate surface during the purging period and to maximize the cleaning effect.

Figure 4:
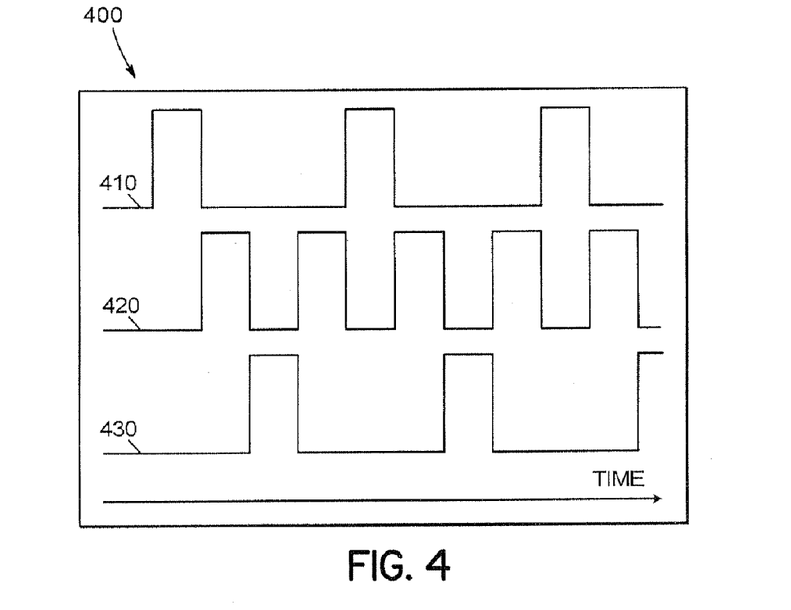
FIG. 4 schematically shows alternating gas exposures during an ALD process according to an embodiment of the invention.

FIG. 4 schematically shows alternating gas exposures during an ALD process for depositing a first ruthenium metal layer on a substrate according to an embodiment of the invention. The process 400 schematically shows the timing of gas exposures of a ruthenium organometallic precursor 410, an inert purge gas 420, and a hydrogen-containing gas 430 (in the presence of plasma (PEALD) or without a plasma (TALD)), according to an embodiment of the invention. However, those skilled in the art will appreciate that the timing diagram depicted in FIG. 4 is only exemplary, as other timing diagrams may be used to practice embodiments of the invention. For example, the exposures of the inert purge gas may be omitted from the ALD process.

Metal deposition using ALD processing normally results in good step coverage and good conformality of the metal layer on patterned substrates since ALD is a layer-by-layer deposition process. Conformality is commonly defined as the thinnest part of the metal layer on the sidewall of a feature on the patterned substrate divided by the thickest part of the metal layer on the sidewall. Step coverage is commonly defined as the metal layer thickness on the sidewall divided by the metal layer thickness away from the feature. Due to the sequential exposure steps used in ALD processing, ALD can have relatively low deposition rates, and thus limits the total thickness of the first ruthenium metal layer that can be deposited in a reasonable amount of time. However, the relatively low deposition rates are less important, as the thickness of the metal layer can be only a few nanometers (nm).

Referring back to FIG. 3, at 306, a second ruthenium metal layer is deposited onto the first ruthenium metal layer in a thermal chemical vapor deposition (TCVD) process using a ruthenium organometallic precursor and a reducing agent containing a hydrogen-containing gas. In the TCVD process, the ruthenium organometallic precursor and the reducing agent are simultaneously exposed to the substrate to deposit the second ruthenium metal layer. Unlike the ALD process in step 304, the TCVD process can have a high deposition rate but lower step coverage and conformality.

According to an embodiment of the invention, the first and second ruthenium metal layer can be deposited at a substrate temperature between about 50° C. and about 600° C., for example, between about 200° C. and about 300° C. The substrate temperature for depositing the first ruthenium metal layer can be selected where the ruthenium organometallic precursor does not undergo self-decomposition, as self-decomposition would not result in self-limiting layer-by-layer growth, which in turn can result in thickness non-uniformity. The substrate temperature for depositing the second ruthenium metal layer can be selected where the ruthenium organometallic precursor, when mixed with a hydrogen-containing gas, deposits a ruthenium metal layer in a CVD process. In one embodiment, the substrate temperature for depositing the second ruthenium metal layer by CVD is greater than the substrate temperature for depositing the first ruthenium metal layer by ALD.

According to an embodiment of the invention, the process chamber pressure can be maintained at a pressure between about 5 mTorr and about 30 Torr during depositing of the first and second ruthenium metal layers. According to an embodiment of the invention, the process chamber pressure can be maintained at a higher pressure during depositing of the second ruthenium metal layers than during depositing of the first ruthenium metal layer. In one example, the process chamber pressure can be maintained between about 5 mTorr and about 500 mTorr during depositing of the first ruthenium metal layer. In another example, the process chamber pressure can be maintained between about 500 mTorr and about 30 Torr during depositing of the second ruthenium metal layer.

As would be appreciated by those skilled in the art, each of the steps or stages in the flowchart of FIG. 3 may encompass one or more separate steps and/or operations. Accordingly, the recitation of only three steps in 302, 304, 306 should not be understood to limit the method of the present invention solely to three steps or stages. Moreover, each representative step or stage 302, 304, 306 should not be understood to be limited to only a single process.

Figure 5A:
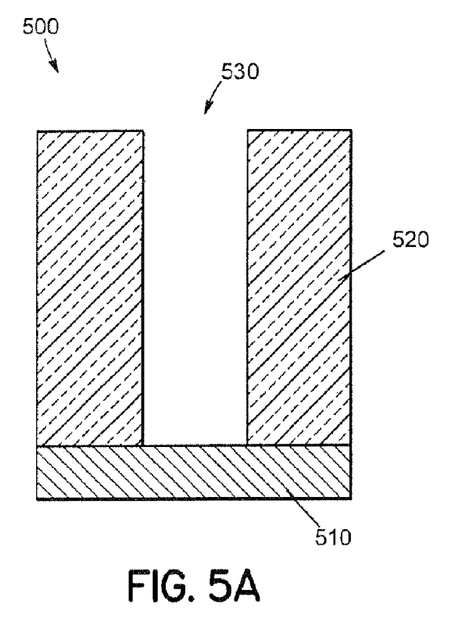
FIGS. 5A-5D schematically show formation of a Ru metal layer on a patterned substrate according to embodiments of the invention.

FIGS. 5A-5D schematically show formation of a ruthenium metal layer on a patterned substrate according to embodiments of the invention. As those skilled in the art will readily appreciate, embodiments of the invention can be applied to patterned substrates containing one or more vias or trenches, or combinations thereof. FIG. 5A schematically shows a patterned structure 500 according to an embodiment of the invention. The patterned structure 500 contains a first metal layer 510, and a patterned layer 520 containing an opening 530. The patterned layer 520 can, for example, be a dielectric material. The opening 530 can, for example, be a via or a trench. As those skilled in the art will appreciate, the patterned structure can further contain a barrier layer (not shown) formed on the exposed surface of the patterned layer 520 and the first metal layer 510. The barrier layer can, for example, be a tantalum-containing layer (e.g., Ta, TaN, or TaCN, or a combination thereof) or a tungsten-containing layer (e.g., W, or WN, or a combination thereof).

Figure 5B:
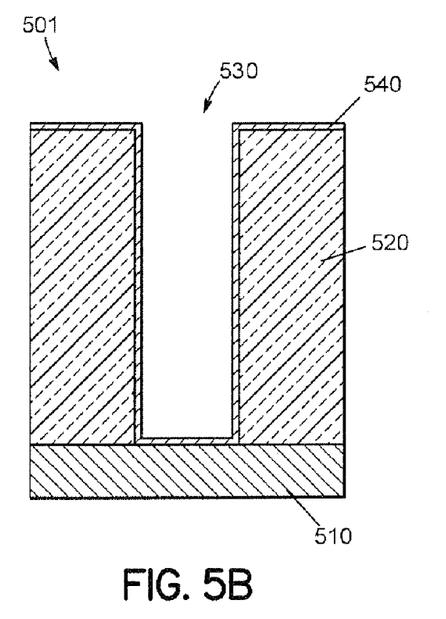

FIG. 5B schematically shows a patterned structure 501 containing a first ruthenium metal layer 540 deposited according to an embodiment of the invention. As described in FIG. 3, the first ruthenium layer 540 can be deposited in an ALD (PEALD or TALD) process where the layer 540 has good conformality and good step coverage. The thickness of the first ruthenium layer 540 can, for example, be between about 1 nm and about 10 nm.

Figure 5C:
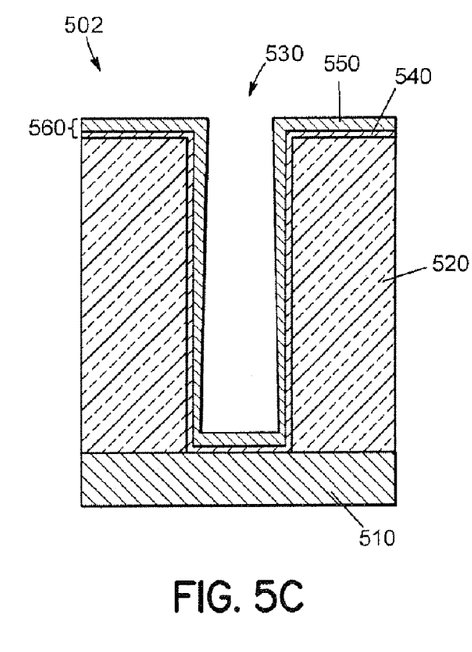

FIG. 5C schematically shows a patterned structure 502 containing a second ruthenium metal layer 550 deposited onto the first ruthenium metal layer 540 according to an embodiment of the invention. As described in FIG. 3, the second ruthenium layer 550 can be deposited in a CVD process. The resulting ruthenium layer 560 contains the first ruthenium layer 540 and the second ruthenium layer 550. The thickness of the second ruthenium layer 550 can, for example, be between about 5 nm and about 20 nm. According to an embodiment of the invention, the thickness of the layer second ruthenium layer 550 can be greater than the thickness of the first ruthenium layer 540.

Figure 5D:
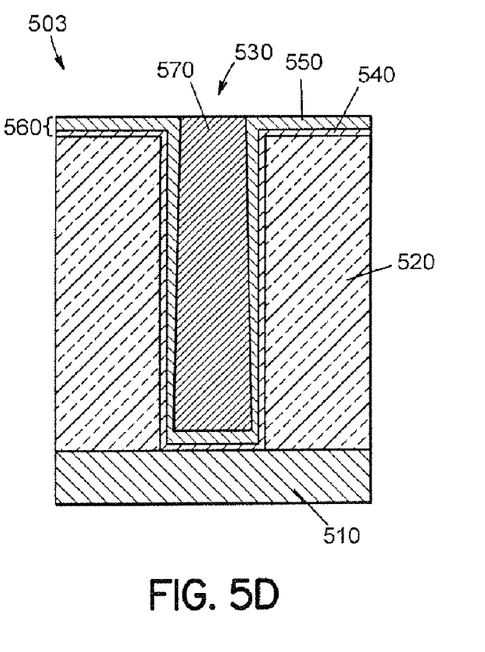

FIG. 5D schematically shows a patterned structure 503 containing a Cu layer 570 formed on the second ruthenium layer 550 in the opening 530. The Cu layer 550 can be formed by depositing Cu on the structure 503 in an electroplating (EP) process and planarizing the structure 503 in a chemical mechanical polishing (CMP) process. The ruthenium layer 560 covering the feature 503 can act as a seed layer in the EP process to achieve voidless filling of the opening 530.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming a ruthenium metal layer, comprising:

providing a patterned substrate in a process chamber of a deposition system, wherein the patterned substrate comprises one or more vias or trenches, or combinations thereof;

heating the patterned substrate to a first temperature and establishing a first pressure within the process chamber;

depositing a first ruthenium metal layer on the patterned substrate while maintaining the first temperature and the first pressure in an atomic layer deposition process comprising the alternating steps of first, exposing the substrate to a ruthenium organometallic precursor, and second, exposing the substrate to $H_2$ and/or $NH_3$ gas;

increasing the temperature of the patterned substrate from the first temperature to a higher second temperature and increasing the pressure in the process chamber from the first pressure to a higher second pressure; and depositing a second ruthenium metal layer on the first ruthenium metal layer while maintaining the second temperature and the second pressure in a thermal chemical vapor deposition process comprising concurrently exposing the patterned substrate to a ruthenium organometallic precursor and $H_2$ and/or $NH_3$ gas.

2. The method according to claim 1, wherein the depositing a first ruthenium metal layer comprises a plasma-enhanced atomic layer deposition process wherein the second alternating exposure step comprises exposing the substrate to a plasma of the $H_2$ and/or $NH_3$ gas.

3. The method according to claim 1, further comprising:
purging the process chamber with an inert gas between the alternating exposure steps.

4. The method according to claim 1, wherein the first and second alternating exposure steps are performed a desired number of times to deposit the first ruthenium metal layer to a thickness of about 1-10 nm.

5. The method according to claim 1, wherein the depositing a first ruthenium metal layer comprises a thermal atomic layer deposition process.

6. The method according to claim 1, wherein the thickness of the second ruthenium metal layer is greater than the thickness of the first ruthenium metal layer.

7. The method according to claim 1, wherein the first and second ruthenium metal layers are deposited from a ruthenium organometallic precursor comprising at least one of (2,4-dimethylpentadienyl)(ethylcyclopentadienyl) ruthenium, bis(2,4-dimethylpentadienyl) ruthenium, 2,4-dimethylpentadienyl) (methylcyclopentadienyl) ruthenium, or bis (ethylcyclopentadienyl) ruthenium, or a combination thereof.

8. The method according to claim 1, wherein the first pressure is between about 5 mTorr and about 500 mTorr and the second pressure is between about 500 mTorr and about 30 Torr.

9. The method according to claim 1, wherein the patterned substrate further comprises a barrier layer formed thereon onto which the first ruthenium metal layer is deposited, wherein the barrier layer is Ta, TaN, TaCN, W or WN, or a combination thereof.

* * * * *